United States Patent [19]

Bruel

[11] Patent Number: 5,494,835
[45] Date of Patent: Feb. 27, 1996

[54] PROCESS FOR THE PRODUCTION OF A RELIEF STRUCTURE ON A SEMICONDUCTOR MATERIAL SUPPORT

[75] Inventor: Michel Bruel, Veurey, France

[73] Assignee: Commissariat a l'Energie, Paris, France

[21] Appl. No.: 344,560

[22] Filed: Nov. 23, 1994

[30] Foreign Application Priority Data

Dec. 23, 1993 [FR] France ................................ 93 15563

[51] Int. Cl.$^6$ ................................................ H01L 21/266
[52] U.S. Cl. ............................................ 437/24; 437/974
[58] Field of Search ........................... 437/24, 26, 966, 437/974, 937; 148/DIG. 12

[56] References Cited

U.S. PATENT DOCUMENTS

| | | | |
|---|---|---|---|
| 4,717,683 | 1/1988 | Parrillo et al. | 437/34 |
| 5,196,355 | 3/1993 | Wittkower | 437/24 |
| 5,374,564 | 12/1994 | Bruel | 437/24 |

FOREIGN PATENT DOCUMENTS

| | | |
|---|---|---|
| 0533551 | 3/1993 | European Pat. Off. . |
| 2211991 | 7/1989 | United Kingdom . |

OTHER PUBLICATIONS

AE Scientific American, "Binary Optics", W. B. Veldkamp and T. J. McHugh, May 1992, pp. 50–55.

Primary Examiner—Chandra Chaudhari
Attorney, Agent, or Firm—Pearne, Gordon, McCoy & Granger

[57] ABSTRACT

The invention relates to a process for the production of a relief structure on a semiconductor material support, by subjecting a wafer of semiconductor material having a planar face to three steps. The first step includes implantation by bombardment of the planar face of the wafer by means of ions, creating gas microbubble areas in the volume of the wafer, each area being positioned with respect to the planar face at a depth dependent on the implantation energy of the ions received by said area, so that all the implanted areas define a profile in the volume of the wafer. The profile defines, on the side of the planar face, an upper region of the wafer constituting a thin film and, on the side opposite to the planar face, a lower region constituting the mass of the substrate. The second step includes joining the planar face of the wafer to a stiffener constituted by at least one rigid material layer. The third step includes heat treating the assembly constituted by the wafer and the stiffener at an adequate temperature to create a separation between the thin film and the mass of the substrate along the profile, the separation leading to a relief structure on the film and to an inverted relief structure on the substrate.

10 Claims, 3 Drawing Sheets

PROCESS FOR THE PRODUCTION OF A RELIEF STRUCTURE ON A SEMICONDUCTOR MATERIAL SUPPORT

BACKGROUND OF THE INVENTION

The present invention relates to a process for producing a relief structure on a semiconductor material support. This process more particularly makes it possible to produce in advantageous manner devices for binary optics on a semiconductor material support, more especially silicon.

The basic principles of binary optics are simple and apply both to optics in reflection and optics in refraction. These principles are defined in the article entitled "Binary optics" by W. B. VELDKAMP and T. J. McHUGH, published in Scientific American, May 1992.

One of the simplest structures which can be produced in binary optics is the prism, which is in the form of a series of staircase microsteps cut into the surface of the material. When the wave front reaches the surface, the wave is subdivided into secondary wave fronts in accordance with the Huygens-Fresnel principle. Each secondary wave front is delayed in proportion to the height of the step at this point, i.e. the traversed optical path supplement. When the wave fronts interfere with one another, they produce a new wave front propagating with a certain angle with respect to the direction of the incident wave front.

In the binary optics approach, it is sufficient to have a material thickness of approximately 1 μm (corresponding to the wave length λ of an incident light beam) to obtain the deflection effect, whereas in the conventional approach it would have been necessary to have a piece of glass with a thickness of several millimeters.

Thus, the production of binary optics devices makes it necessary to be able to locally produce on the surface of a material areas in overthickness or underthickness (the overthickness or underthickness having to be precisely obtained, because they correspond to a fraction of the use wavelength of the device). The location of these areas is a function of the optical function to be produced. In the same optics, there can be several ranges of overthicknesses or underthicknesses, e.g. corresponding to step differences of $\lambda/8$, $\lambda/4$, $3\lambda/8$, $\lambda/2$, etc.

Conventionally, in order to obtain such a binary optics device, use is made of thin film deposition methods, when is wished to obtain a relief structure, associated with lithography and etching methods for producing overthickness areas. When it is wished to have a hollow structure, use is made of lithography methods for location and etching (e.g. in dry form).

These prior art production processes suffer from disadvantages with respect to the control and reproducibility of the thicknesses of the areas and also relative to the complexity of the operations necessary for producing several thickness ranges.

With regards to the control and reproducibility of the thicknesses, the result obtained is linked with the reaction kinetics and the reaction application time. In general, the parameters of the process are regulated and it is applied for a predetermined period of time. In general there is no indicator, during the application of the process, of the current thickness or depth. There can be a very considerable uncertainty with regards to the result.

For producing several thickness ranges, it has been found that when the process is used for obtaining a thickness range in a given area, the other areas must be protected against the application of the process. This leads to complexity with regards to the lithography, as well as boundary problems between the areas due to imperfect alignments.

In addition, FR-A-2 681 472 discloses a process for the production of thin semiconductor material films involving three stages. In a first stage, creation takes place by ion implantation of a layer of gas microbubbles under one face of a semiconductor material wafer. In a second stage, the wafer face is joined to a stiffener. In a third stage the assembly constituted by the wafer and the stiffener is subject to a temperature adequate for creating, by the crystal-line rearrangement effect in the wafer and pressure in the microbubbles, a cleaving of the wafer level with the layer of microbubbles, which gives a thin film adhering to the stiffener.

The present invention proposes a novel process for producing a relief structure on a semiconductor material support using a procedure derived from the teaching of FR-A-2 681 472. Thus, the novel process makes it possible to obviate the disadvantages of the prior art production processes.

SUMMARY OF THE INVENTION

Therefore the invention relates to a process for the production of a relief structure on a semiconductor material support, characterized in that it consists of subjecting a wafer of said semiconductor material having a planar face and whose plane is either substantially parallel to a main crystallographic plane in the case where the semiconductor material is monocrystalline, or slightly inclined with respect to a crystallographic plane with the same indexes for all the grains in the case where the material is polycrystalline, to the three following stages:

a first stage of implanting by bombardment of the planar face of said wafer by means of ions, creating areas of gas microbubbles, all the areas defining a profile in the volume of said wafer, each area being positioned with respect to said planar face at a depth dependent on the implantation energy of the ions received by the surface of the face facing said area and being of the same geometry as said surface, said profile defining, on the side of the planar face, an upper region of the wafer constituting a thin film and, on the side opposite to the planar face, a lower region constituting the mass of the substrate, the ions being chosen from among hydrogen gas or rare gas ions and the temperature of the wafer during implantation being maintained below the temperature at which the gas produced by the implanted ions can escape from the semiconductor by diffusion, a second stage of joining the planar face of said wafer to a stiffener constituted by at least one rigid material layer, a third stage of heat treating the assembly constituted by the wafer and the stiffener at an adequate temperature for creating a separation between the thin film and the mass of the substrate along said profile, tile separation bringing about a relief structure on the thin film and an inverted relief structure on the substrate.

During the first stage, the areas of gas microbubbles having different implantation energies can be obtained by successive implantation stages.

During the first stage, all the areas of gas microbubbles can be simultaneously created by means of a screen or shield positioned on the path of the ions, said screen being traversable by the ions whilst reducing their energy levels and having a thickness varying locally in accordance with a pattern corresponding to the areas of microbubbles to be created in order to allow the passage of the implantation energy necessary for each area.

With a view to obtaining a given structure profile, it is firstly possible to produce a relief structure approaching by excess said given profile, then performing a fourth stage consisting of polishing the approaching structure until the given profile is obtained.

With a view to obtaining a given structure profile, it is firstly possible to produce a relief structure approaching by default the said given profile and then performing a fourth stage consisting of filling the approaching structure until the given profile is obtained.

The semiconductor can be silicon, the implanted ions hydrogen or helium gas ions, the implantation temperature can be between 20° and 400° C. and the temperature of the third heat treatment stage can exceed 450° C.

The invention is described in greater detail hereinafter relative to non-limitative embodiments and the attached drawings, wherein show:

DETAILED DESCRIPTION OF THE PREFERRED EMBODIMENT

Figure 1:
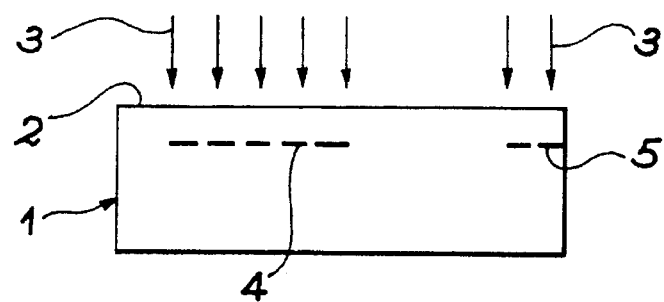
FIGS. 1 to 4 A first method of applying the production process for a relief structure according to the invention.

FIG. 1 shows a wafer 1 of semiconductor material, e.g. monocrystalline silicon, said wafer being viewed from the side.

It has an upper planar face 2 through which, by implantation, areas of gas microbubbles can be produced in its volume. It is assumed that implantation is desired of two areas corresponding to a first ion energy level and two areas corresponding to a second ion energy level, said second level being higher than the first.

The ions used for implantation by bombardment are e.g. H$^+$ ions, but it would also be possible to use molecular ions of hydrogen or ions of rare gases such as helium, neon, krypton and xenon, used singly or in combination. The object of the present invention is more particularly applicable to semiconductors of group IV, e.g. silicon, germanium, silicon carbide and silicon-germanium alloys.

The aforementioned document FR-A-2 681 472 provides explanations concerning the implantation of H$^+$ ions in a monocrystalline silicon wafer.

In FIG. 1, the implantation of ions covered by the general reference 3 causes, for a given implantation energy, two areas of gas microbubbles 4 and 5 located at the same depth of the planar face 2 of the wafer 1. It is possible to implant each area 4 or 5 successively or simultaneously by placing a mask on the path of the ion beam.

Figure 2:
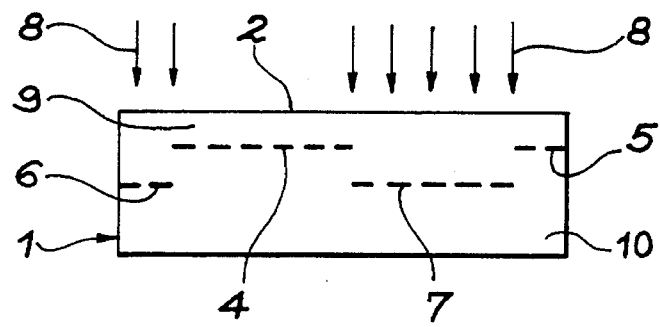

In the same way and as illustrated in FIG. 2, implantation takes place of the areas 6 and 7 positioned more deeply in the wafer 1, using higher energy ions referenced in general terms by the numeral 8. In the present case, areas 6 and 7 rejoin areas 4 and 5, if all these areas are projected onto the planar face 2.

The location of the implantation at clearly defined areas can be brought about by known procedures, e.g. using an implantation through a resin mask obtained by photolithography or implantation through a metal mask having openings.

All these implanted areas form a profile defining an upper region 9 and a lower region 10 in the wafer volume.

Figure 3:
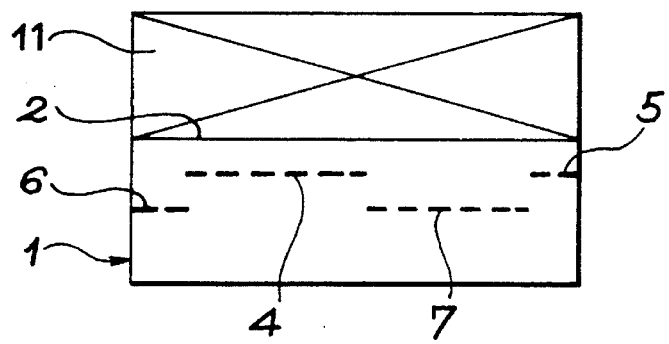

FIG. 3 shows the semiconductor wafer 1, obtained at the end of the first stage and rendered integral with a stiffener 11 by its planar face 2. The stiffener can be fixed to the semiconductor wafer by bonding using a substance which adheres both to the stiffener and to the wafer. However, in preferred manner the stiffener is joined to the wafer by inter-atomic bonds, as described in FR-A-2 681 472 or EP-A-533 351. The stiffener must be able to withstand the heat treatment of the third stage without any deterioration and must remain joined to the wafer.

The heat treatment must be carried out at a temperature such that crystalline rearrangement and coalescence of the bubbles can effectively take place. In the case of a silicon wafer, a temperature above 450° C. is necessary for the separation to take place.

Figure 4:
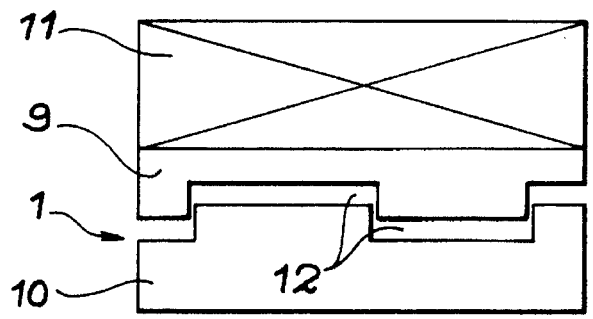

FIG. 4 shows the result obtained after the heat treatment. The upper region 9 and lower region 10 are kept separate by the space 12, at the location of the implanted areas and linking areas between the same. The fracture at the linking areas is due to the embrittlement induced between two relatively close cleaving planes.

Figure 5:
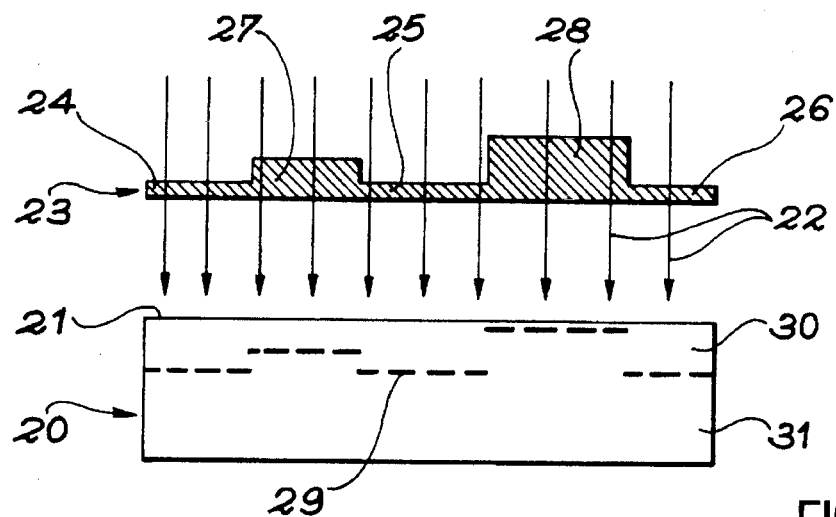
FIGS. 5 to 7 A second embodiment of the process for producing a relief structure according to the invention.
Figure 6:
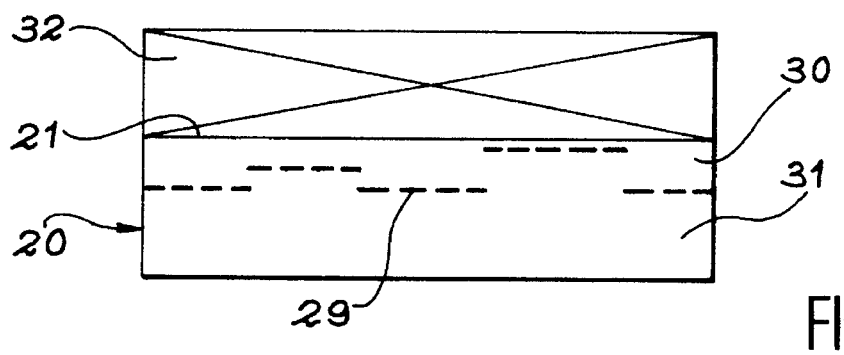
Figure 7:
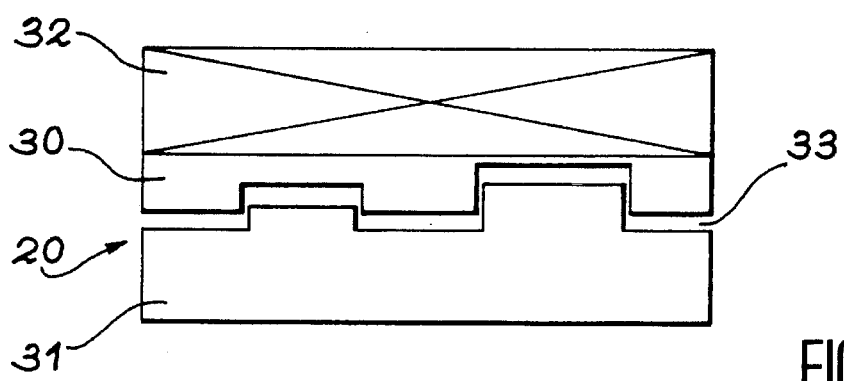

FIGS. 5 to 7 illustrate a second embodiment of the invention using a screen or shield.

The wafer 20 of semiconductor material, e.g. monocrystalline silicon, has an upper planar face 21 through which it is wished to perform the implantation, which will create gas microbubble areas in its volume. Implantation takes place by placing on the path of the ions, carrying the general reference 22, a screen 23 which call be traversed by the ions, but whose thickness affects the energy thereof. The thicker the screen, the more the energy of the ions is reduced. This screen can e.g. be made from silicon or SiC.

In the embodiment shown in FIG. 5, the screen 23 has three different thicknesses. The regions 24, 25 and 26 have the same thickness, region 27 is slightly thicker and region 28 is even thicker. On said screen is produced in relief the structure which it is wished to obtain in the wafer.

Ion bombardment, e.g. by H$^+$ ions of an appropriate chosen energy, takes place over the entire surface of the planar face 21, through the screen 23. The ion penetrate more or less deeply into the wafer 20, as a function of the traversed screen thickness. They give rise to a continuous profile 29 of gas microbubbles defining an upper region 30 and a lower region 31 in the wafer volume.

This embodiment is of particular interest because, once the screen has been produced, there will be no further problem regarding the reciprocal positioning of the different areas. A single implantation is sufficient and the screen can be used several times.

The sequence of stages is identical to the first embodiment of the process. FIG. 6 shows the second stage of the process, a stiffener 32 being joined to the planar face 21 of the wafer 20. FIG. 7 shows the result obtained following the heat treatment. The upper region 30 and lower region 31 are now separated by the space 33 at the location of the implanted areas and the linking areas, fractured as in the first embodiment which has already been described.

Finally, a relief structure is obtained on the thin film adhering to the stiffener and an inverted relief structure on the remainder of the wafer, i.e. on a semiconductor substrate.

The thus obtained structures can have level variations of a few fractions of a µm to a few dozen µm. The thus obtained structures can be used in the field of binary optics and can also be used as a mould for producing a polymer optics device.

Figure 8:
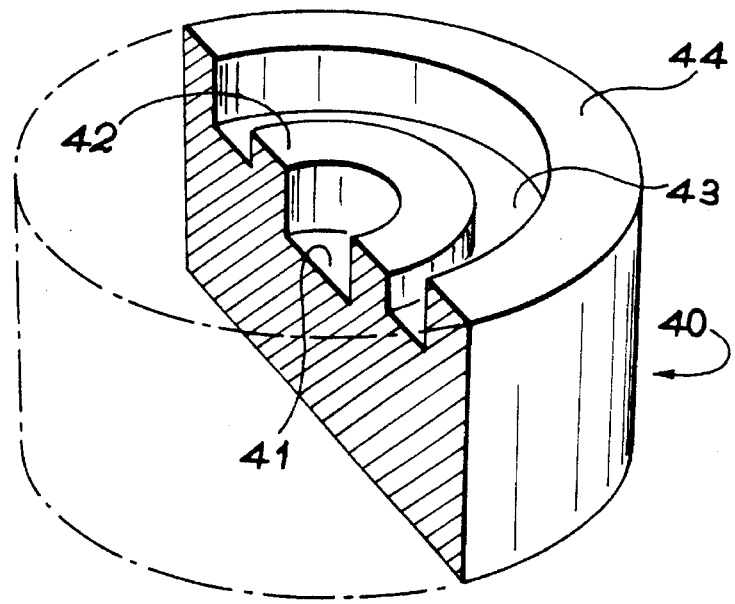
FIG. 8 A part perspective view of a binary optics device produced by the process according to the invention.

FIG. 8 illustrates an exemplified application of the invention. It is a cylindrical prism 40 for binary optics. Its upper face has a relief structure obtained by the process of the invention. The prism 40 is e.g. constituted by the mass of a substrate following the removal of the upper film joined to the stiffener. In the represented case, the structure is constituted by a central blind hole 41 and concentric rings 42, 43, 44 of different heights.

Figure 9:
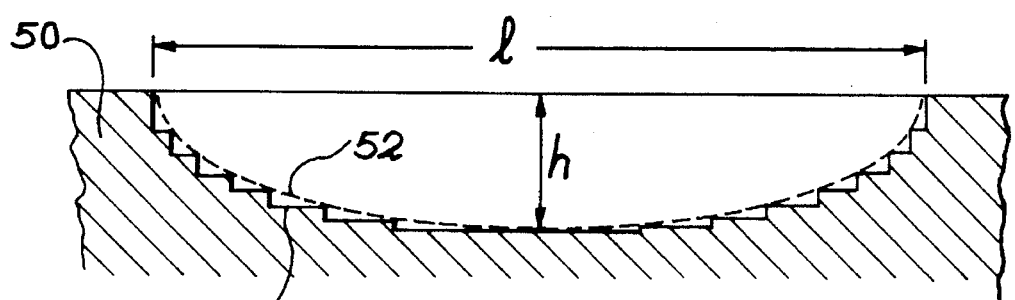
FIGS. 9 and 10 Another embodiment obtained by the process according to the invention.
Figure 10:
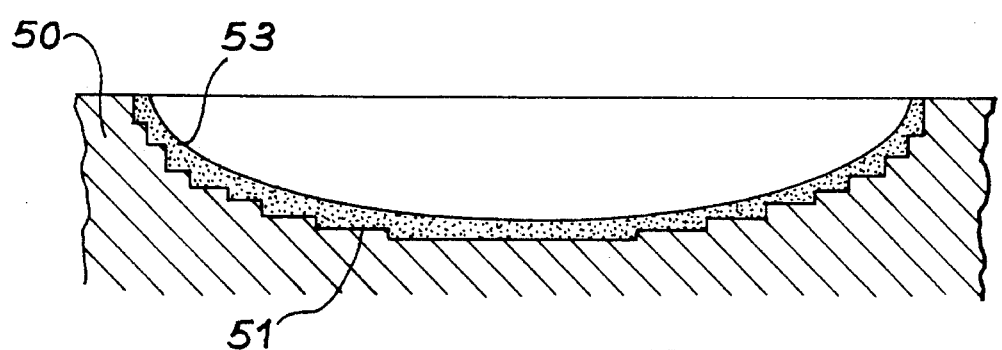

FIGS. 9 and 10 are sectional views illustration an application of the invention to a field different from binary optics. It is a question of obtaining a mold for producing a conventional optical element of reduced size, e.g. a polymer lens.

Using the process according to the invention, a relief structure 51 is produced on a semiconductor material support 50, which is constituted either by a film adhering to a stiffener or by the remainder of the semiconductor wafer used. The structure 51 consists of an approximation of a cup 52 to be obtained. The approximation is obtained by a staircase shape given to the structure. The final shape of the mold is obtained by using a smoothing deposit 53, e.g. of silicon (cf. FIG. 10).

Another manner of proceeding consists of producing the relief structure by approaching the profile of the cup to be obtained, but without reaching it and then finely polishing the structure until the desired profile is obtained.

By means of the process according to the invention, it is e.g. possible to obtain a 40 µm diameter cup for a maximum depth of 4 µm. The invention is particularly interesting for obtaining relatively shallow molds, i.e. where the ratio h/1 is small. Thus, these molds are difficult to produce by other methods.

The optical element to be produced from such a mold can then be obtained by deposition or application under pressure of a polymer layer to the mold.

I claim:

1. Process for the production of a relief structure on a semiconductor material support, the semiconductor support being produced from a wafer of semiconductor material having a planar face which is either substantially parallel to a main crystallographic plane where the semiconductor material is monocrystalline, or slightly inclined with respect to a crystallographic plane with the same indexes for all grains where the material is polycrystalline, said process comprising the steps of:

implanting the wafer with ions by bombardment of the planar face of said wafer to create areas of gas microbubbles, the areas defining a profile in a cross-section of said wafer, each area being positioned with respect to said planar face at a depth dependent on the implantation energy of the ions received by a portion of the face facing said area and being of the same geometry as said portion of the face, said profile defining, on the side of the planar face, an upper region of the wafer constituting a thin film of the semiconductor material and, on the side opposite to the planar face, a lower region constituting a mass of the semiconductor material, the ions being chosen from among hydrogen gas or rare gas ions, and the wafer during implantation being maintained at a temperature below a temperature at which gas produced by the implanted ions can escape by diffusion;

joining the planar face of said wafer to a stiffener constituted by at least one rigid material layer after implanting the wafer with ions;

heat treating the wafer after joining the stiffener at an adequate temperature for creating a separation between the thin film and the mass along said profile, the separation bringing about a relief structure on the thin film and an inverted relief structure on the mass.

2. Process according to claim 1, wherein said step of implanting the wafer with ions includes successive implantation steps to obtain the areas of the gas microbubbles having different implantation energies.

3. Process according to claim 1, wherein said step of implanting the wafer with ions simultaneously creates all the areas of gas microbubbles by means of a screen located on the path of the ions, the screen being traversable by the ions while reducing their energies and having a thickness varying locally in accordance with a pattern corresponding to the areas of microbubbles to be created in order to obtain the implantation energy for each area.

4. Process according to claim 1, wherein said relief structure produced by said step of heat treating the wafer includes excess material relative to a desired profile and further comprising the step of polishing the relief structure until the desired profile is obtained.

5. Process according to claim 1, wherein said relief structure produced by said step of heat treating the wafer includes less material than a desired profile and further comprising the step of filling the relief structure with material until the desired profile is obtained.

6. Process according to claim 1, wherein said semiconductor is silicone, the implanted ions are helium or hydrogen gas ions, the implantation temperature is between 20° and 400° degrees C., and the temperature of the third heat treatment stage exceeds 450° degrees C.

7. Process according to claim 1, wherein said stiffener is bonded to the wafer by means of an adhesive substrate.

8. Process according to claim 1, wherein said stiffener is joined to the wafer by means of inter-atomic bonds.

9. Process according to any one of the claims 1 to 8 for the production of devices for binary optics.

10. Process according to any one of the claims 1 to 8 for the production of molds for obtaining devices made from polymer.

\* \* \* \* \*

UNITED STATES PATENT AND TRADEMARK OFFICE
CERTIFICATE OF CORRECTION

PATENT NO. : 5,494,835
DATED : February 27, 1996
INVENTOR(S) : Bruel

It is certified that error appears in the above-indentified patent and that said Letters Patent is hereby corrected as shown below:

On title page, item [73], the following information should be inserted with respect to the assignee: --Commissariat A L'Energie Atomique, Paris, France --.

Column 2, line 58, delete "tile" and insert --the--.

Column 4, line 38, delete "call" and insert --can--.

Signed and Sealed this

Ninth Day of July, 1996

Attest:

BRUCE LEHMAN

*Attesting Officer*  *Commissioner of Patents and Trademarks*